(12) United States Patent
Kim et al.

(10) Patent No.: US 9,978,816 B2
(45) Date of Patent: May 22, 2018

(54) ORGANIC LIGHT EMITTING DIODE DISPLAY AND MANUFACTURING METHOD THEREOF

(71) Applicant: Samsung Display Co., Ltd., Yongin-si, Gyeonggi-do (KR)

(72) Inventors: Young Do Kim, Cheonan-si (KR); Hoon Sik Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/073,415

(22) Filed: Mar. 17, 2016

(65) Prior Publication Data

US 2016/0315123 A1    Oct. 27, 2016

(30) Foreign Application Priority Data

Apr. 24, 2015    (KR) .................. 10-2015-0058112

(51) Int. Cl.
*H01L 27/32*    (2006.01)
*H01L 51/52*    (2006.01)

(52) U.S. Cl.
CPC .......... *H01L 27/323* (2013.01); *H01L 27/322* (2013.01); *H01L 27/3272* (2013.01); *H01L 51/5284* (2013.01)

(58) Field of Classification Search
CPC .................................................. H01L 51/5284
See application file for complete search history.

(56) References Cited

U.S. PATENT DOCUMENTS 9,577,222 B2 *    2/2017    Seo .................. H01L 51/5265
2014/0168585 A1    6/2014    Huang et al.
2014/0187001 A1    7/2014    Guo

FOREIGN PATENT DOCUMENTS

KR    10-2012-0122634 A    11/2012
KR    10-2014-0060642 A    5/2014
KR        10-1401177 B1    5/2014

* cited by examiner

*Primary Examiner* — Fernando L Toledo
*Assistant Examiner* — Valerie N Newton
(74) *Attorney, Agent, or Firm* — Lewis Roca Rothgerber Christie LLP

(57) ABSTRACT

An organic light emitting diode display according to one or more embodiments of the present invention includes: a substrate; a plurality of organic light emitting elements disposed on the substrate and configured to emit light; a touch panel on the plurality of organic light emitting elements; a window on the touch panel; and a first light blocking layer at a surface of the window and corresponding to paths of light emitted from the plurality of organic light emitting elements and having an exposed region exposing a portion of the window.

11 Claims, 10 Drawing Sheets

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2015-0058112, filed in the Korean Intellectual Property Office on Apr. 24, 2015, the entire contents of which are incorporated herein by reference.

BACKGROUND OF THE INVENTION

1. Field

The present disclosure relates to an organic light emitting diode display and a manufacturing method thereof.

2. Description of the Related Art

An organic light emitting element of an organic light emitting diode display includes two electrodes and an organic emission layer positioned therebetween, and an electron injected from a cathode, which is one electrode, and a hole injected from an anode, which is the other electrode, are coupled with each other in the organic emission layer to generate an exciton, and light is emitted by emitting energy of the exciton.

The organic light emitting diode display includes a plurality of pixels including an organic light emitting element configured by the cathode, the anode, and the organic emission layer, and in each pixel, a plurality of transistors and storage capacitors for driving the organic light emitting element are formed. The plurality of transistors typically includes a switching transistor and a driving transistor.

Each pixel may be partitioned by a pixel defining layer in which an emission area is opened, and in the opened emission area of the pixel defining layer, an organic light emitting element including an organic emission layer emitting light of red, green, and blue may be formed.

In addition, configurations such as a polarization film, a phase difference film, a black thin film, and a color filter are formed thereon to configure the display panel.

In the case of the display panel having such configurations, because a thickness is increased by configurations such as the pixel defining layer, the polarization film, the phase difference film, and the color filter, and other multiple configurations exist on the organic light emitting element, light emission efficiency deteriorates.

The above information disclosed in this Background section is only for enhancement of understanding of the background of the invention and therefore it may contain information that does not form the prior art.

SUMMARY

Aspects of embodiments of the present invention are directed to an organic light emitting diode display and a manufacturing method thereof capable of reducing costs and time generated in a manufacturing process of the organic light emitting diode display.

According to one or more exemplary embodiments of the present invention, an organic light emitting diode display includes: a substrate; a plurality of organic light emitting elements on the substrate and configured to emit light; a touch panel on the plurality of organic light emitting elements; a window on the touch panel; and a first light blocking layer at a surface of the window and corresponding to paths of light emitted from the plurality of organic light emitting elements and having an exposed region exposing a portion of the window.

The organic light emitting diode display may further include a second light blocking layer at the surface of the window and corresponding to an edge region of the window.

The first and second light blocking layers may be integral.

The first light block layer may be different in thickness from that of the second light blocking layer.

The surface may be a lower surface of the window.

The first and second light blocking layers may include a light blocking material.

Each of the plurality of organic light emitting elements may include a first electrode on the substrate; an organic emission layer on the first electrode and configured to emit light; and a second electrode on the organic emission layer.

The plurality of organic light emitting elements may include first to third organic light emitting elements configured to emit light of red, green, and blue, respectively.

The organic light emitting diode display may further include a color filter layer including first to third color filters, the first to third color filters corresponding to the paths of light of the first to third organic light emitting elements, respectively.

The color filter layer may be between the touch panel and the plurality of organic light emitting elements.

A first adhesive layer may be between the color filter layer and the touch panel, and a second adhesive layer may be between the touch panel and the window.

The color filter layer may be at a surface of the window and at the exposed region of the first light blocking layer.

A second adhesive layer may be between the touch panel and the window.

According to one or more exemplary embodiments of the present invention, a method of manufacturing an organic light emitting diode display includes: preparing a substrate; forming a plurality of organic light emitting elements on the substrate, each of the organic light emitting elements being configured to emit light; forming a color filter layer on the plurality of organic light emitting elements, the color filter layer corresponding to light paths of the plurality of organic light emitting elements; disposing a touch panel on the color filter layer; forming a first light blocking layer on a surface of the window to have an exposed region exposing a portion of the window; and disposing the window on the touch panel so that the exposed region of the first light blocking layer corresponds to the light paths of the plurality of organic light emitting elements.

In the forming of the first light blocking layer on the surface of the window, a second light blocking layer corresponding to an edge region of the window may be concurrently formed on the surface of the window.

The first and second light blocking layers may be formed by utilizing a half-tone mask.

According to one or more exemplary embodiments of the present invention, a method of manufacturing an organic light emitting diode display includes: preparing a substrate; forming a plurality of organic light emitting elements on the substrate, each of the organic light emitting elements being configured to emit light; disposing a touch panel on the plurality of organic light emitting elements; forming a first light blocking layer on a surface of the window to have an exposed region exposing a portion of the window; and disposing the window on the touch panel so that the exposed region of the first light blocking layer corresponds to light paths of the plurality of organic light emitting elements.

In the forming of the first light blocking layer on the surface of the window, a second light blocking layer corresponding to an edge region of the window may be concurrently formed on the surface of the window.

The first and second light blocking layers may be formed by utilizing a half-tone mask.

The manufacturing method may further include forming a color filter layer in the exposed region of the first light blocking layer on the surface of the window, in which the color filter layer may correspond to the light paths of the plurality of organic light emitting elements.

According to the display device described above, the first and second light blocking layers may be integrally formed on a lower surface of a window to reduce manufacturing costs and a manufacturing time as compared with a manufacturing process of an organic light emitting diode display in the related art.

Further, the first light blocking layer may be formed on the lower surface of the window to reduce external reflectance.

DETAILED DESCRIPTION

Figure 1:
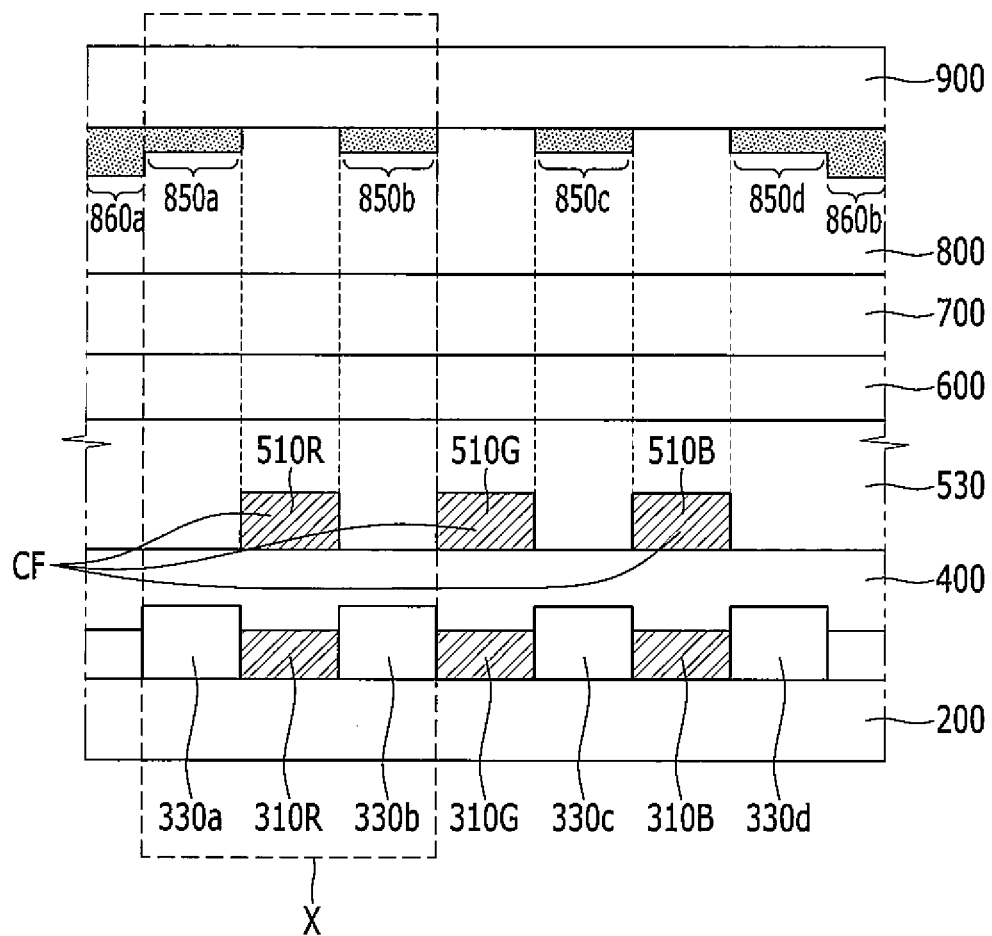
FIG. 1 is a schematic cross-sectional view of an organic light emitting diode display according to one or more embodiments of the present invention.

The present invention is described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

In the drawings, the thickness and/or size of layers, areas, films, panels, regions, etc., may be exaggerated for clarity.

Hereinafter, an organic light emitting diode display according to one or more exemplary embodiments of the present invention is described with reference to FIGS. 1 to 3.

Figure 2:
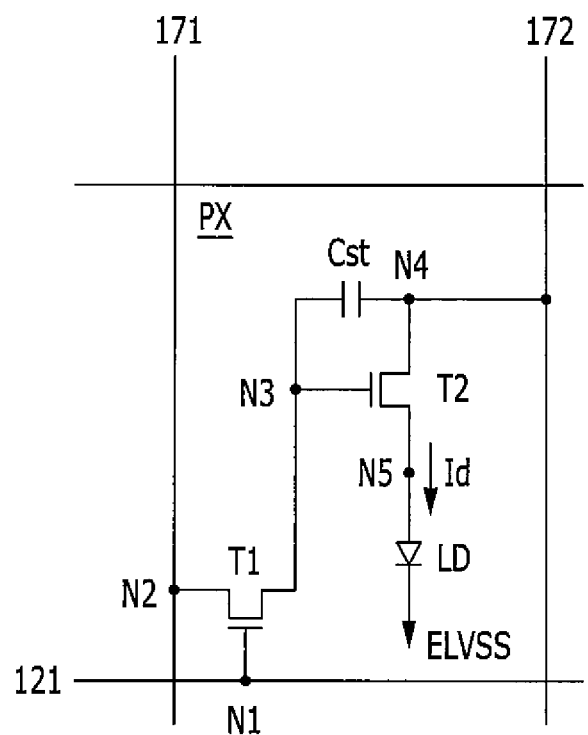
FIG. 2 is an equivalent circuit diagram of one pixel of an organic light emitting diode display according to one or more embodiments of the present invention.
Figure 3:
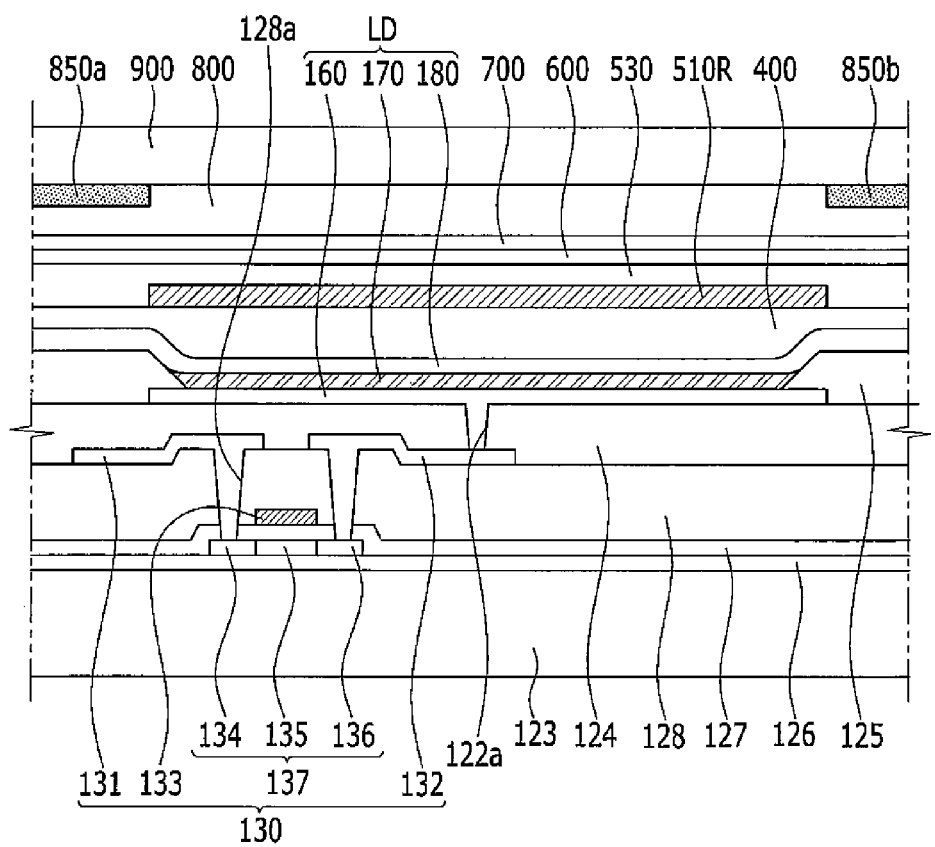
FIG. 3 is a partial cross-sectional view of the organic light emitting diode display in the region X of FIG. 1.

FIG. 1 is a schematic cross-sectional view of an organic light emitting diode display according to one or more exemplary embodiments of the present invention, FIG. 2 is an equivalent circuit diagram of one pixel of an organic light emitting diode display according to one or more exemplary embodiments of the present invention, and FIG. 3 is a partial cross-sectional view of the organic light emitting diode display in the region X of FIG. 1.

Referring to FIG. 1, the organic light emitting diode display according to one or more exemplary embodiments includes a substrate 200, a plurality of organic light emitting elements 310R, 310G, and 310B, a touch panel 700, a window 900, and first and second light blocking layers 850 and 860.

The substrate 200 may be formed as an insulation substrate made of glass, quartz, ceramic, and/or plastic. However, the present invention is not limited thereto, and the substrate 200 may be made of an insulating material with flexibility such as polyimide (PI), polyetherimide (PEI), polyethylene terephthalate (PET), polycarbonate (PC), polymetal methyl methacrylate (PMMA), polystyrene (PS), styrene acrylic nitrile copolymer (SAN), and/or silicone-acrylic resin. The substrate 200 of FIG. 1 corresponds to a substrate 123 of FIG. 3.

A plurality of organic light emitting elements 310R, 310G, and 310B that are configured to emit light may be disposed on the substrate 200. The plurality of organic light emitting elements may include first to third organic light emitting elements 310R, 310G, and 310B, which emit light of red, green, and blue, respectively. Each of the first to third organic light emitting elements 310R, 310G, and 310B may be disposed in a pixel area which is partitioned by pixel defining layers 330a, 330b, 330c, and 330d.

In addition, each of the first to third organic light emitting elements 310R, 310G, and 310B may be configured by a first electrode 160, an organic emission layer 170, and a second electrode 180. Additional description for the organic light emitting elements 310R, 310G, and 310B is provided below with reference to FIGS. 2 and 3.

An encapsulation layer 400 may be formed on the first to third organic light emitting elements 310R, 310G, and 310B. The encapsulation layer 400 encapsulates and protects (or substantially protects) the first to third organic light emitting elements 310R, 310G, and 310B and a driving circuit unit from the outside.

The encapsulation layer 400 according to one or more exemplary embodiments of the present invention may be an encapsulation member, which performs encapsulation by a sealant. The sealant used as the encapsulation member may be formed of various materials such as, for example, glass, quartz, ceramic, plastic, and/or metal.

A thin film encapsulation layer may also be formed by depositing an inorganic layer and an organic layer on a second electrode 180 without using the sealant. The thin film encapsulation layer may include an encapsulation organic layer and an encapsulation inorganic layer, and these layers may be alternately laminated one by one. For example, two encapsulation organic layers and two encapsulation inorganic layers may be alternately laminated one by one to configure the encapsulation layer 400, but the present invention is not limited thereto.

According to one or more exemplary embodiments of the present invention, a color filter layer CF may be formed on the encapsulation layer 400. The color filter layer CF may include a first color filter 510R, a second color filter 510G, and a third color filter 510B having different colors. For example, in one or more exemplary embodiments, the first color filter 510R may be red, the second color filter 510G may be green, and the third color filter 510B may be blue.

In this case, the first to third color filters 510R, 510G, and 510B are positioned to correspond to paths of light emitted from the first to third organic light emitting elements 310R, 310G, and 310B, respectively. In one or more exemplary embodiments, the first color filter 510R may be positioned to correspond to the light path of the first organic light emitting element 310R. That is, the first color filter 510R and the first organic light emitting element 310R may be disposed in parallel. In detail, the first color filter 510R may be disposed in parallel with an organic emission layer of the first organic light emitting element 310R, described further below.

Further, the second color filter 510G may be positioned to correspond to the light path of the second organic light emitting element 310G, and the second color filter 510G and the second organic light emitting element 310G may be disposed in parallel. The third color filter 510B may be positioned to correspond to the light path of the third organic light emitting element 310B, and the third color filter 510B and the third organic light emitting element 310B may be disposed in parallel.

Figure 7:
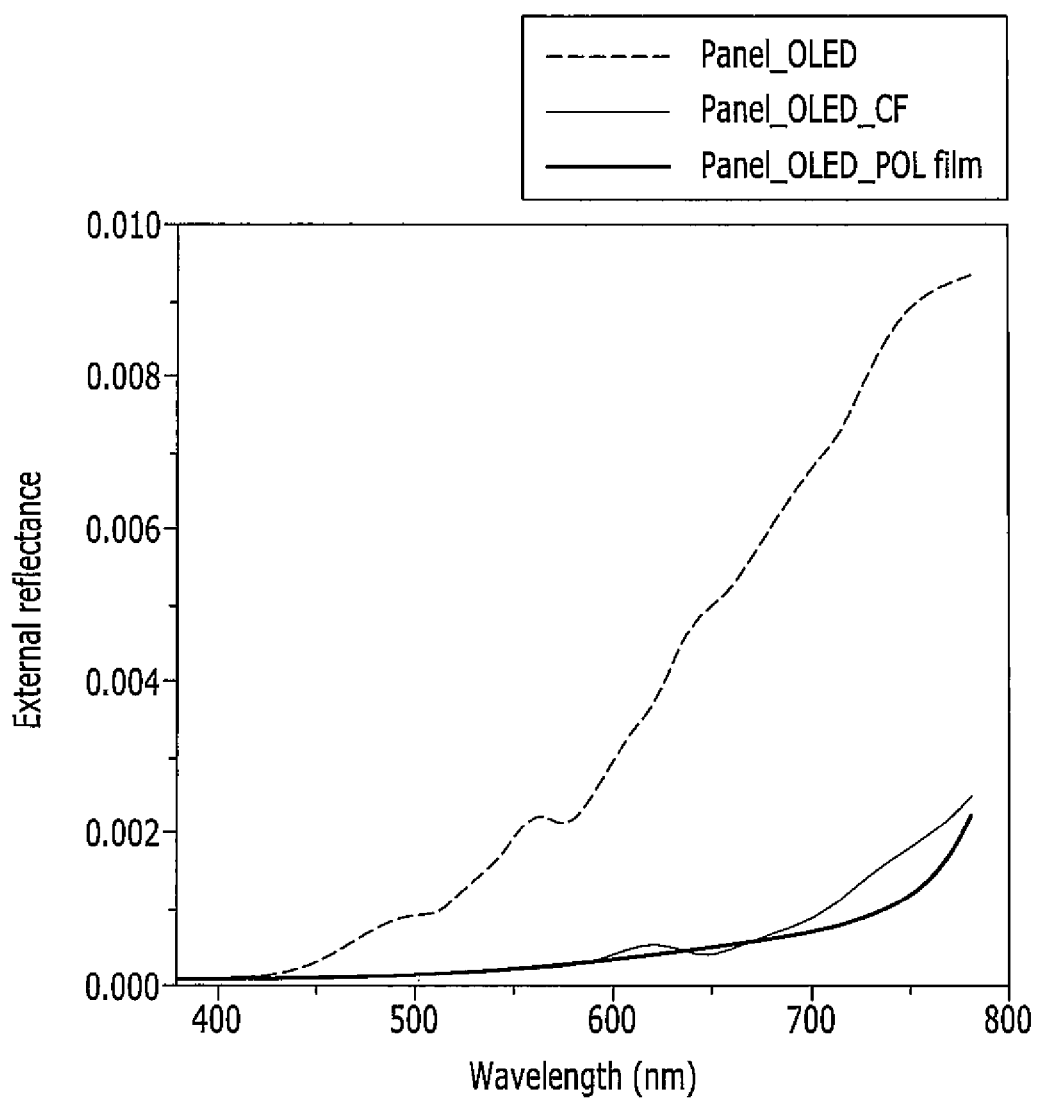
FIG. 7 is a graph of an effect of reducing external reflection by the organic light emitting diode display according to one or more embodiments of the present invention.

FIG. 7 is a graph illustrating an effect of reducing external reflection by the organic light emitting diode display according to one or more embodiments of the present invention. As illustrated in FIG. 7, in the case of an organic light emitting diode display Panel_OLED without a polarization film or a color filter layer, external reflectance is high as compared to an organic light emitting diode display Panel_OLED_POL film including a polarization film and an organic light emitting diode display Panel_OLED_CF including a color filter layer according to one or more exemplary embodiments of the present invention.

That is, like the exemplary embodiments of the present invention, the organic light emitting diode display including the color filter layer has reduced external reflectance as compared with the organic light emitting diode display without the color filter layer and may have a similar effect with the organic light emitting diode display including the polarization film.

An overcoat 530 for protecting the color filter and planarizing a surface of the layer with the color filter may be provided on the first to third color filters 510R, 510G, and 510B.

The overcoat 530 may use an inorganic insulating layer or an organic insulating layer. In this case, in the inorganic insulating layer, SiO2, SiNx, SiON, Al2O3, TiO2, Ta2O5, HfO2, ZrO2, BST, PZT, or the like may be included, and in the organic insulating layer, a general purpose polymer (PMMA and/or PS), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, and/or a blend thereof may be included. The overcoat 530 may be formed as a complex laminate of an inorganic insulating layer and/or an organic insulating layer. Further, by considering light emission efficiency, a material with high transmittance may be used.

In one or more exemplary embodiments of the present invention, a touch panel 700 may be disposed on the overcoat 530 covering the color filter layer CF. The touch panel 700 may sense a touch by an external object (e.g., may be configured to sense a touch by an external object). Here, the touch includes not only a case where an external object such as a user's hand directly touches the top of the organic light emitting diode display but also a case where the external object approaches the organic light emitting diode display or hovers while approaching the organic light emitting diode display.

In this case, a first adhesive layer 600 may be interposed between the touch panel 700 and the overcoat 530. The touch panel 700 may be attached onto the color filter layer CF by the first adhesive layer 600.

The first adhesive layer 600 may use a silicon and/or acryl-based compressive adhesive such as a PSA with a low modulus value, but the present invention is not limited thereto. In one or more embodiments, the overcoat formed on the color filter layer CF may be omitted.

In addition, a second adhesive layer 800 may be disposed on the touch panel 700. The window 900 may be attached to or onto the touch panel 700 by the second adhesive layer 800. The second adhesive layer 800 may use a silicon or acryl-based compressive adhesive such as a PSA with a low modulus value like the first adhesive layer 600, but the present invention is not limited thereto.

In the organic light emitting diode display according to one or more exemplary embodiments of the present invention, a first light blocking layer 850 and a second light blocking layer 860 may be formed on a surface (e.g., a lower surface) of the window 900. The first and second light blocking layers 850 and 860 may be integrally formed on the lower surface of the window 900. Here, the first and second light blocking layers 850 and 860 may be integrally formed on the lower surface of the window 900 by using a half-tone mask. Additional description thereof is described below with reference to a manufacturing method of the organic light emitting diode display according to one or more embodiments of the present invention.

In this case, the first and second light blocking layers 850 and 860 may be made of a light blocking material which blocks light from being transmitted. For example, a known material configured as a black matrix BM may be applied to the first and second light blocking layers 850 and 860.

The first light blocking layer 850 (e.g., a plurality of first light blocking layers 850a, 850b, 850c, and 850d) defines an exposed region to expose a portion (or a part) of the window 900. In more detail, a plurality of exposed regions in which the portions of the window 900 are exposed are formed on the first light blocking layers 850a, 850b, 850c, and 850d. In this case, the plurality of exposed regions are disposed to correspond to the path of light emitted from each of the first to third organic light emitting elements 310R, 310G, and 310B.

For example, the light emitted from the first organic light emitting element 310R moves along the light path to pass through the exposed region between the first light blocking layers 850a and 850b. The light emitted from the second organic light emitting element 310G moves along the light path to pass through the exposed region between the first light blocking layers 850b and 850c. Further, the light emitted from the third organic light emitting element 310B moves along the light path to pass through the exposed region between the first light blocking layers 850c and 850d.

That is, the light generated from each of the first to third organic light emitting elements 310R, 310G, and 310B passes through the exposed region of each corresponding first light blocking layer to be emitted to the outside through the window 900, and the remaining portion of the first light blocking layer except for the exposed region may block the light from being transmitted.

According to one or more exemplary embodiments of the present invention, the first light blocking layers 850a, 850b,

850c, and 850d may be formed on the lower surface of the window 900 to reduce external reflectance.

The second light blocking layer 860 (e.g., a plurality of second light blocking layers 860a and 860b) may be disposed in an edge region of the window 900. The second light blocking layers 860a and 860b may block an internal configuration disposed in the edge region of the organic light emitting diode display from being exposed to the outside.

As described above, the second light blocking layers 860a and 860b may be integrally formed with the first light blocking layer 850. Thicknesses of the first and second light blocking layers 850 and 860 may be different from each other by the half-tone mask. For example, in one or more exemplary embodiments, the thickness of the first light blocking layer 850 may be smaller than the thickness of the second light blocking layer 860.

Figure 6:
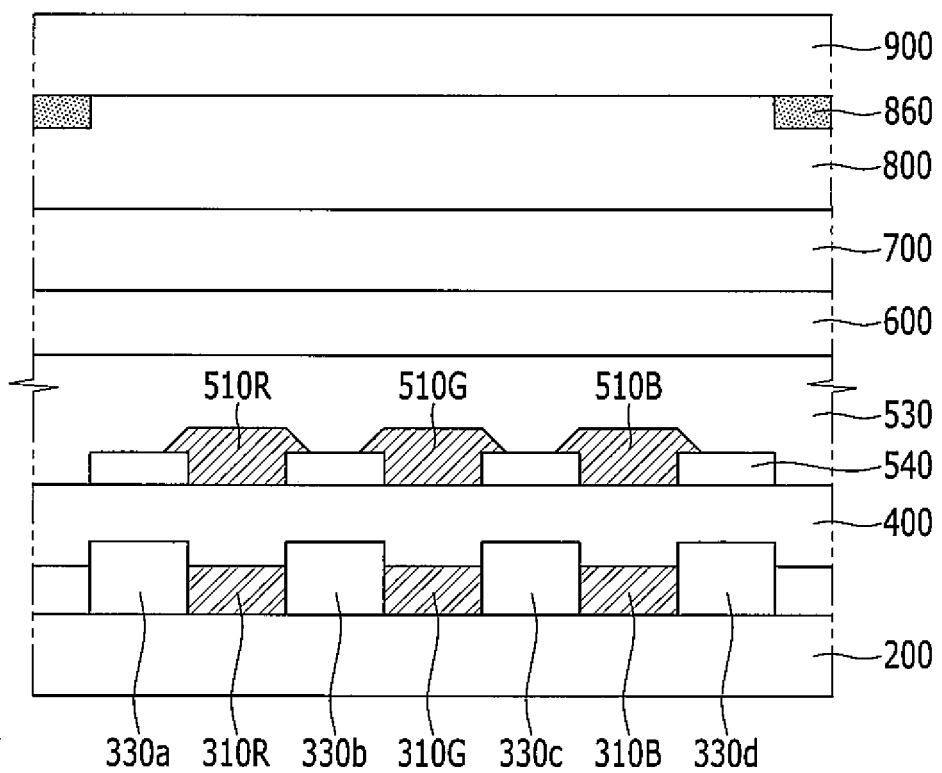
FIG. 6 is a schematic cross-sectional view of an organic light emitting diode display in the related art.

FIG. 6 is a schematic cross-sectional view of an organic light emitting diode display in the related art. In the organic light emitting diode display in the related art, a first light blocking layer 540 is formed between first to third color filters 510R, 510G, and 510B. That is, in the organic light emitting diode display in the related art, the first light blocking layer 540 and the second light blocking layer 860 are positioned on different layers from each other. As a result, in the organic light emitting diode display in the related art, in order to form the first and second light blocking layers 540 and 860, a separate process is required.

However, in the organic light emitting diode display according to one or more exemplary embodiments of the present invention, the first light blocking layer 850 is integrally formed with the second light blocking layer 860 on the lower surface of the window 900. That is, unlike the related art, the first and second light blocking layers 850 and 860 may be formed by one process. As a result, in the organic light emitting diode display according to one or more exemplary embodiments of the present invention, process costs and a process time may be reduced as compared with a manufacturing process of the organic light emitting diode display in the related art.

Hereinafter, a structure of the organic light emitting diode display according to one or more exemplary embodiments of the present invention are described in more detail with reference to FIGS. 2 and 3.

FIG. 2 is an equivalent circuit diagram of one pixel of the organic light emitting diode display, and FIG. 3 is a partial cross-sectional view of the organic light emitting diode display in the region X of FIG. 1.

Referring to FIG. 2, the organic light emitting diode display may include a plurality of signal lines 121, 171, and 172, and a pixel PX connected thereto. The pixel PX may be one of a red pixel, a green pixel, and a blue pixel.

The signal lines include a scanning signal line 121 that transfers a gate signal (or, alternatively, a scanning signal), a data line 171 that transfers a data signal, a driving voltage line 172 that transfers driving voltage, and the like. The scanning signal lines 121 extend substantially in a row direction and are substantially parallel to each other, and the data lines 171 extend substantially in a column direction and are substantially parallel to each other. The driving voltage lines 172 extend substantially in a column direction, but may extend in a row direction or a column direction or may be formed in a net shape.

In one or more embodiments, one pixel PX includes a thin film transistor including a switching transistor T1 and a driving transistor T2, a storage capacitor Cst, and an organic light emitting element LD. One pixel PX may further include a thin film transistor and a capacitor in order to compensate for a current provided to the organic light emitting element.

The switching transistor T1 has a control terminal N1, an input terminal N2, and an output terminal N3. The control terminal N1 is connected to the scanning signal line 121, the input terminal N2 is connected to the data line 171, and the output terminal N3 is connected to the driving transistor T2. The switching transistor T1 transfers the data signal received from the data line 171 to the driving transistor T2 in response to the scanning signal received from the scanning signal line 121.

In addition, the driving transistor T2 also has a control terminal N3 (i.e., the output terminal N3 of the switching transistor T1), an input terminal N4, and an output terminal N5. The control terminal N3 is connected to the switching transistor T1, the input terminal N4 is connected to the driving voltage line 172, and the output terminal N5 is connected to the organic light emitting element LD. The driving transistor T2 runs an output current Id of which an amplitude varies according to a voltage applied between the control terminal N3 and the output terminal N5.

In one or more exemplary embodiments of the present invention, the capacitor Cst is connected between the control terminal N3 and the input terminal N4 of the driving transistor T2. The capacitor Cst charges the data signal applied to the control terminal N3 of the driving transistor T2, and maintains the charged data signal even after the switching transistor T1 is turned off.

The organic light emitting element LD, for example, an organic light emitting diode (OLED), has an anode connected to the output terminal N5 of the driving transistor T2 and a cathode connected to a common voltage Vss. The organic light emitting element LD emits light by varying the intensity according to the output current Id of the driving transistor T2 to display an image.

The organic light emitting element LD may include an organic material, which uniquely emits any one or more of the primary colors, such as three primary colors of red, green, and blue, for example, and the organic light emitting diode display displays a desired image by a spatial sum of the colors.

The switching transistor T1 and the driving transistor T2 may be n-channel field effect transistors (FET), but at least one of the switching transistor T1 and the driving transistor T2 may be a p-channel field effect transistor. Further, a connection relationship among the transistors T1 and T2, the capacitor Cst, and the organic light emitting element LD may be changed.

Hereinafter, the organic light emitting diode display is described with reference to a cross-sectional view thereof, illustrated in FIG. 3.

Referring to FIG. 3, a substrate 123, which corresponds to the substrate 200 of FIG. 1 described above, may be formed of an insulation substrate made of glass, quartz, ceramic, plastic, and/or the like.

A substrate buffer layer 126 may be formed on the substrate 123. The substrate buffer layer 126 serves to prevent or substantially prevent impurity elements from penetrating and planarize the surface.

In one or more exemplary embodiments, the substrate buffer layer 126 may be made of various materials capable of performing the aforementioned functions. For example, one of a silicon nitride ($SiN_x$) layer, a silicon oxide ($SiO_2$) layer, and a silicon oxynitride ($SiO_xN_y$) layer may be used as the substrate buffer layer 126. However, in one or more embodiments, the organic light emitting diode display may omit the substrate buffer layer 126 according to a kind of substrate 123 used and/or a process condition.

A driving semiconductor layer 137 may be formed on the substrate buffer layer 126. The driving semiconductor layer 137 is formed as a polysilicon layer. Further, the driving semiconductor layer 137 includes a channel region 135 in which impurities are not doped, and a source region 134 and a drain region 136 in which the impurities are doped at both sides of the channel region 135. In this case, the doped ion materials are p-type (p-channel) impurities such as boron (B), and $B_2H_6$ may be used. Here, the impurities vary according to a kind of thin film transistor.

A gate insulating layer 127 made of silicon nitride (SiNx) and/or silicon oxide ($SiO_2$) is formed on the driving semiconductor layer 137. A gate line including a driving gate electrode 133 is formed on the gate insulating layer 127. In addition, the driving gate electrode 133 is formed to overlap with at least a part of the driving semiconductor layer 137, particularly, the channel region 135.

An interlayer insulating layer 128 that covers the driving gate electrode 133 is formed on the gate insulating layer 127. A contact hole 128a exposing the source region 134 and the drain region 136 of the driving semiconductor layer 137 is formed in the gate insulating layer 127 and the interlayer insulating layer 128. The interlayer insulating layer 128 may be formed by using a ceramic-based material such as silicon nitride ($SiN_x$) and/or silicon oxide ($SiO_2$), like the gate insulating layer 127.

In addition, a data line including a driving source electrode 131 and a driving drain electrode 132 is formed on the interlayer insulating layer 128. Further, the driving source electrode 131 and the driving drain electrode 132 are connected with the source region 134 and the drain region 136 of the driving semiconductor layer 137 through the contact holes 128a formed in the interlayer insulating layer 128 and the gate insulating layer 127, respectively.

As such, the driving thin film transistor 130 (including the driving semiconductor layer 137, the driving gate electrode 133, the driving source electrode 131, and the driving drain electrode 132) is formed. The configuration of the driving thin film transistor 130 is not limited to the aforementioned example, and may be variously modified according to any suitable configuration which may be easily implemented by those skilled in the art.

In addition, a planarization layer 124 covering the data line is formed on the interlayer insulating layer 128. The planarization layer 124 may remove a step and planarize a surface in order to increase emission efficiency of the organic light emitting element to be formed thereon. Further, the planarization layer 124 has an electrode via hole 122a exposing a part of the drain electrode 132.

The planarization layer 124 may be made of one or more of polyacrylate resin, epoxy resin, phenolic resin, polyamides resin, polyimide resin, unsaturated polyester resin, polyphenylene ether resin, polyphenylene sulfide resin, and benzocyclobutene (BCB).

The present invention is not limited to the aforementioned structure, and in some embodiments, one of the planarization layer 124 and the interlayer insulating layer 128 may be omitted.

In this case, a first electrode 160 of the organic light emitting element is formed on the planarization layer 124. The first electrode 160 is connected to the drain electrode 132 through the electrode via hole 122a of the planarization layer 124.

An organic emission layer 170 is formed on the first electrode 160, and a second electrode 180 is formed on the organic emission layer 170. As such, the organic light emitting element LID (including the first electrode 160, the organic emission layer 170, and the second electrode 180) is formed. The organic light emitting element LD of FIG. 3 corresponds to the first to third organic light emitting elements 310R, 310G, and 310B of FIG. 1.

In one or more exemplary embodiments, the first electrode 160 is an anode which is a hole injection electrode, and the second electrode 180 is a cathode which is an electron injection electrode. However, the present invention is not necessarily limited thereto, and according to a driving method of the organic light emitting diode display, in some embodiments, the first electrode 160 may be the cathode, and the second electrode 180 may be the anode. The hole and electron are injected into the organic emission layer 170 from the first electrode 160 and the second electrode 180, respectively; and an exciton generated by coupling the injected hole and electron falls down from an excited state to a ground state to emit light.

Further, the organic emission layer 170 of the exemplary embodiment may be formed by a multilayer including one or more of a light emission layer, a hole injection layer (HIL), a hole transporting layer (HTL), an electron transporting layer (ETL), and an electron injection layer (EIL). In the case where the organic emission layer 170 includes all the layers, the HIL is disposed on the first electrode 160 which is the anode, and the HTL, the light emitting layer, the ETL, the EIL are sequentially laminated thereon.

In this case, each of the first electrode 160 and the second electrode 180 may be made of a transparent conductive material, a transflective conductive material, or a reflective conductive material. According to a kind of material forming the first electrode 160 and the second electrode 180, the organic light emitting diode display may be a top emission display, a bottom emission display, or a double-sided emission display.

A capping layer covering and protecting the second electrode 180 may be formed as an organic layer on the second electrode 180.

In addition, an encapsulation layer 400 may be formed on the capping layer. The encapsulation layer 400 encapsulates and protects or substantially protects the organic light emitting element LD formed on the substrate 123 and a driving circuit unit from the outside.

In one or more exemplary embodiments, the encapsulation layer 400, the color filter layer CF, the overcoat 530, the first adhesive layer 600, the touch panel 700, the second adhesive layer 800, the window 900, and the first light blocking layers 850a and 850b are sequentially laminated. Because the description thereof is the same as the contents described above, additional description is omitted.

Hereinafter, organic light emitting diode displays according to one or more exemplary embodiments are described with reference to FIGS. 4 and 5 together with FIG. 1 described above. When describing the organic light emitting diode displays according to one or more exemplary embodiments of the present invention, additional description for the same configurations as the aforementioned display device may be omitted.

Figure 4:
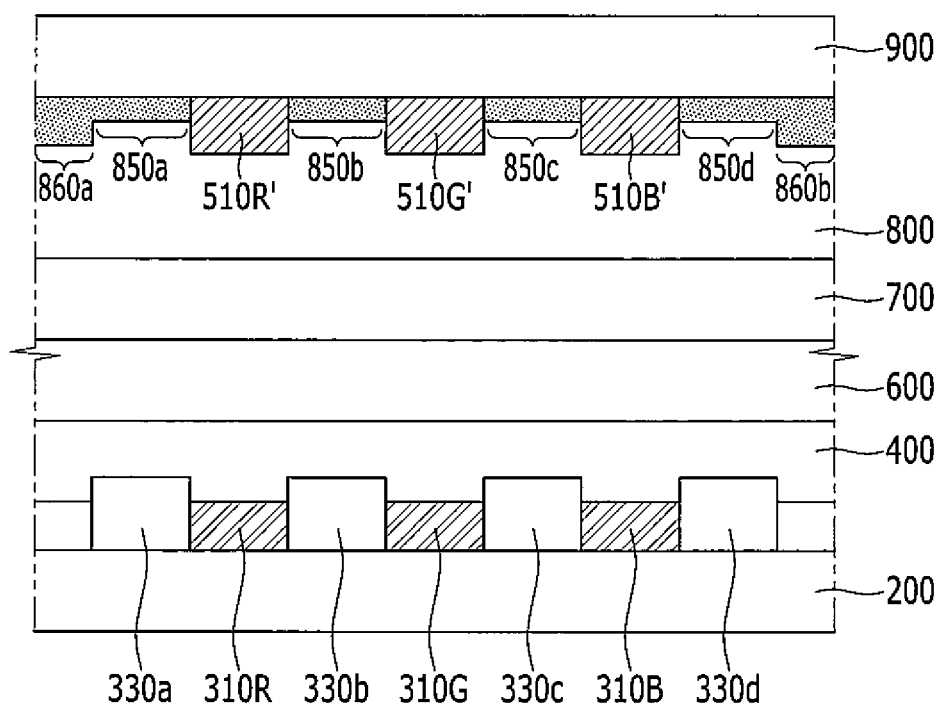
FIG. 4 is a schematic cross-sectional view of an organic light emitting diode display according to one or more exemplary embodiments of the present invention.
Figure 5:
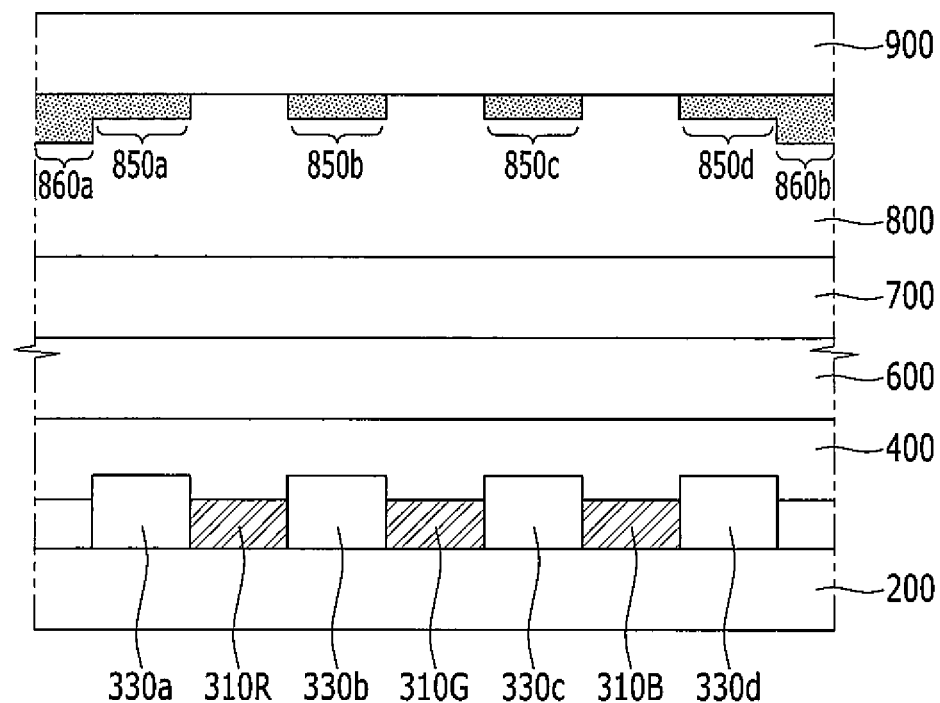
FIG. 5 is a schematic cross-sectional view of an organic light emitting diode display according to one or more exemplary embodiments of the present invention.

FIG. 4 is a schematic cross-sectional view of an organic light emitting diode display according to one or more exemplary embodiments of the present invention, and FIG. 5 is a schematic cross-sectional view of an organic light emitting diode display according to one or more exemplary embodiments of the present invention.

Referring to FIG. 4, in the organic light emitting diode display according to one or more exemplary embodiments of the present invention, the color filter layer CF is formed on the lower surface of the window 900. In one or more exemplary embodiments, the color filter layer CF may be disposed between the touch panel 700 and the first to third organic light emitting elements 310R, 310G, and 310B, as illustrated in FIG. 1. However, in some exemplary embodiments, the color filter layer CF may be disposed below on the lower surface of the window 900, as illustrated in FIG. 4.

In one or more exemplary embodiments of the present invention, the overcoat 530 formed for protecting the first to third color filters 510R, 510G, and 510B and planarizing the surface, described above, may be omitted.

In the organic light emitting diode display according to one or more exemplary embodiments of the present invention, first to third color filters 510R', 510G', and 510B' are disposed in a plurality of exposed regions formed in the first light blocking layers 850a, 850b, 850c, and 850d.

In this case, the first to third color filters 510R', 510G', and 510B' are positioned to correspond to paths of light emitted from the first to third organic light emitting elements 310R, 310G, and 310B, respectively. For example, the first color filter 510R' may be positioned to correspond to the light path of the first organic light emitting element 310R. That is, the first color filter 510R' and the first organic light emitting element 310R may be disposed in parallel. In more detail, the first color filter 510R' may be disposed in parallel with an organic emission layer of the first organic light emitting element 310R.

Further, the second color filter 510G' may be positioned to correspond to the light path of the second organic light emitting element 310G, and the second color filter 510G' and the second organic light emitting element 310G may be disposed in parallel. The third color filter 510B' may be positioned to correspond to the light path of the third organic light emitting element 310B, and the third color filter 510B' and the third organic light emitting element 310B may be disposed in parallel.

Referring to FIG. 5, in the organic light emitting diode display according to one or more exemplary embodiments of the present invention, the color filter layer CF may be omitted. As illustrated in FIGS. 1 and 4, in some exemplary embodiments, the organic light emitting diode display may include the color filter layer CF, but in some exemplary embodiments, as illustrated in FIG. 5, the color filter layer CF may be omitted.

In addition, in one or more exemplary embodiments of the present invention, as illustrated in FIG. 5, the overcoat 530 formed for protecting the first to third color filters 510R, 510G, and 510B and planarize the surface may be omitted.

Hereinafter, a method of manufacturing the organic light emitting diode display according to one or more exemplary embodiments is described with reference to FIGS. 8 and 9 together with FIGS. 1 to 3 described above. When describing the manufacturing method of the organic light emitting diode display, additional description for the same configuration as the aforementioned organic light emitting diode display may be omitted.

Figure 8:
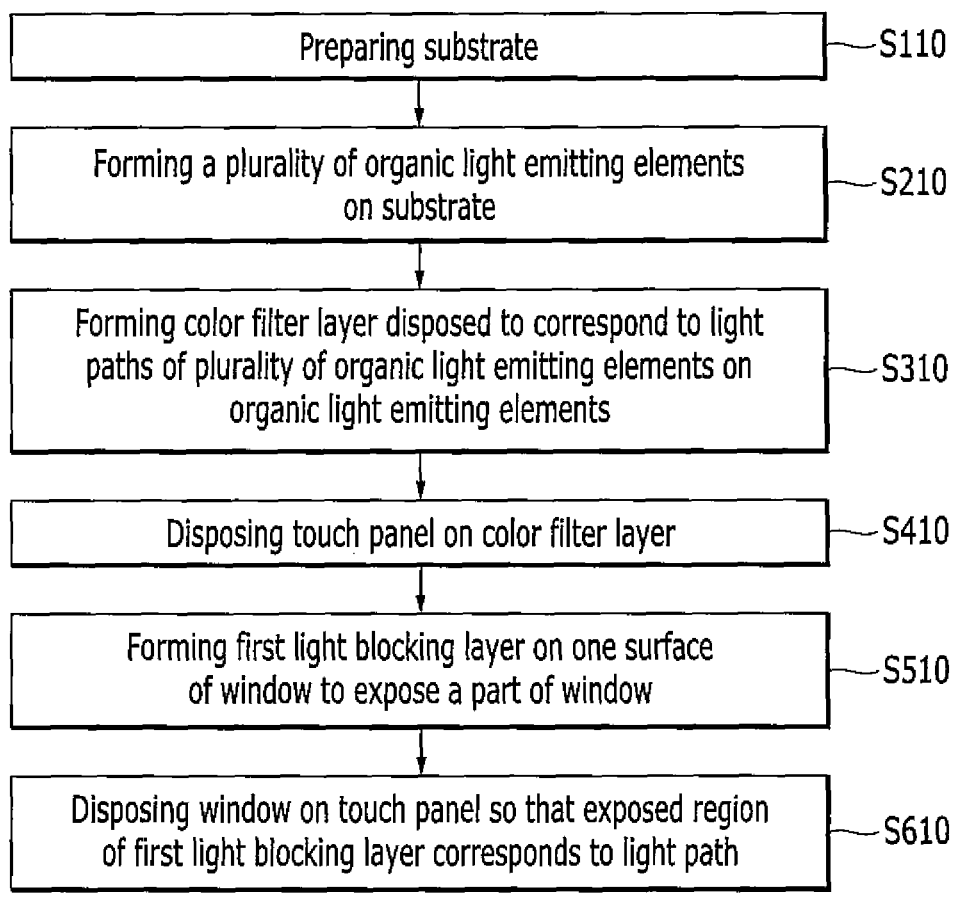
FIG. 8 is a flowchart of a manufacturing method of the organic light emitting diode display according to one or more exemplary embodiments of the present invention.
Figure 9:
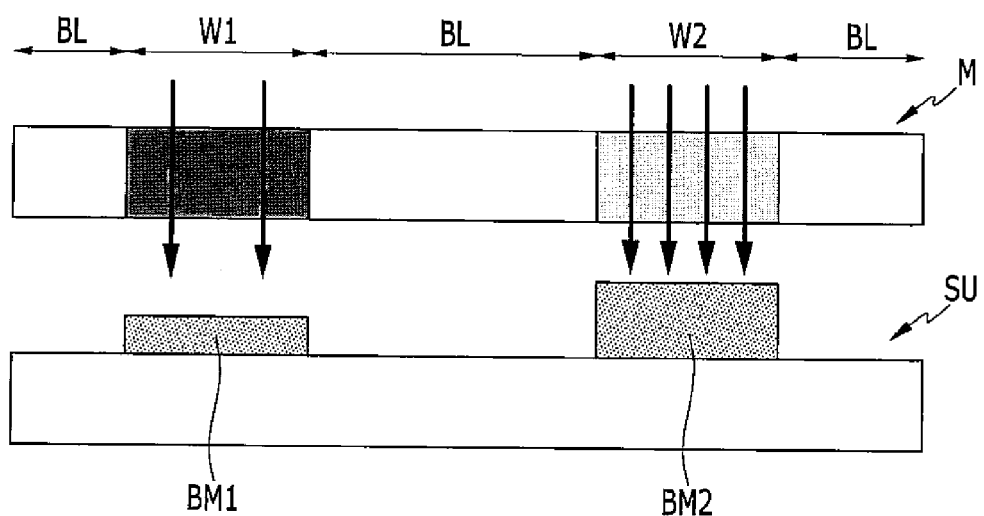
FIG. 9 is a diagram of a process of forming first and second light blocking layers.

FIG. 8 is a flowchart illustrating a manufacturing method of the organic light emitting diode display according to one or more exemplary embodiments of the present invention, and FIG. 9 is a diagram illustrating a process of forming first and second light blocking layers. In this case, FIG. 8 may correspond to a flowchart illustrating the manufacturing method of the organic light emitting diode display of FIG. 1.

First, referring to FIG. 9, a substrate 200, which may be formed with a plurality of organic light emitting elements 310R, 310G, and 310B, is prepared (S110).

Next, the plurality of organic light emitting elements 310R, 310G, and 310B is formed on the substrate 200 (S210). As described above, a thin film transistor TFT, the first electrode 160, the organic emission layer 170, the second electrode 180, the encapsulation layer 400, and the like may be formed on the substrate 200.

Thereafter, the color filter layer CF is formed on the plurality of organic light emitting elements 310R, 310G, and 310B (S310). The first to third color filters 510R, 510G, and 510B may be formed on the encapsulation layer 400 by coating and patterning. In this case, the first to third color filters 510R, 510G, and 510B are positioned to correspond to paths of light emitted from the first to third organic light emitting elements 310R, 310G, and 310B, respectively.

Next, after the first adhesive layer 600 is disposed on the color filter layer CF, the touch panel 700 is disposed on the color filter layer CF (S410). For example, the touch panel 700, which may be manufactured by a module unit, may be attached onto the encapsulation layer 400 by using the first adhesive layer 600. However, the present invention is not limited thereto, and the touch panel 700 may be deposited and formed on the encapsulation layer 400.

In addition, the first light blocking layer 850 and the second light blocking layer 860 may be concurrently (or simultaneously) formed on one surface (e.g. a lower surface) of the window 900 (S510). According to one or more exemplary embodiments, the first and second light blocking layers 850 and 860 may be concurrently (or simultaneously) formed on the lower surface of the window 900 by using a half-tone mask.

Referring to FIG. 9, a half-tone mask M may be disposed above or on a substrate SU. In this case, in the half-tone mask M, a first transmitting unit W1 that transmits only a part of light to which the first transmitting unit W1 is exposed, a second transmitting unit W2 that transmits all of the light to which the second transmitting unit W2 is exposed, and a light blocking unit BL that blocks all of the light to which the light blocking unit BL is exposed are formed. As such, light blocking layers BM1 and BM2 with different thicknesses may be formed on the substrate SU by using one half-tone mask M. Because a known technique may be applied as the process using the half-tone mask applied herein, additional description thereof is omitted.

In this case, the light blocking layer BM1 of FIG. 9 may correspond to the first light blocking layer 850 of FIG. 1, and the light blocking layer BM2 of FIG. 9 may correspond to the second light blocking layer 860 of FIG. 1. As such, in one or more exemplary embodiments, the first and second light blocking layers 850 and 860 may be concurrently (or simultaneously) formed below the window 900 by one process. As a result, process costs and a process time may be reduced as compared with a manufacturing process of the organic light emitting diode display in the related art.

Next, the window 900 is disposed on the touch panel 700 (S610). In this case, the first light blocking layer BM1/850 defining the exposed region to expose a portion of the window 900 (e.g., the first light blocking layers 850a, 850b, 850c, and 850d defining the exposed regions to expose portions of the window 900) is disposed to correspond to light paths of the plurality of organic light emitting elements 310R, 310G, and 310B.

Hereinafter, a manufacturing method of the organic light emitting diode display according to one or more exemplary embodiments is described with reference to FIG. 4 together with FIGS. 1 to 3 described above. When describing the manufacturing method of the organic light emitting diode display, additional detailed description for the same configuration as the aforementioned organic light emitting diode display may be omitted.

Referring to FIG. 4, in the manufacturing method of the organic light emitting diode display according to one or more exemplary embodiments of the present invention, the process of forming the color filter layer CF in the manufacturing method of the organic light emitting diode display described above may be omitted. Furthermore, the process of forming the overcoat 530 covering the color filter layer CF may be omitted.

However, in FIG. 4, as described above, the color filter layer CF is formed on the lower surface of the window 900. In one or more exemplary embodiments, as illustrated in FIG. 1, the color filter layer CF may be disposed between the touch panel 700 and the first to third organic light emitting elements 310R, 310G, and 310B. However, in some exemplary embodiments, as illustrated in FIG. 4, the color filter layer CF may be disposed on the lower surface of the window 900.

Hereinafter, a manufacturing method of the organic light emitting diode display according to one or more exemplary embodiments is described with reference to FIG. 10 together with FIGS. 1 to 3 and 5, described above. When describing the manufacturing method of the organic light emitting diode display, additional description for the same configuration as the aforementioned organic light emitting diode display may be omitted.

Figure 10:
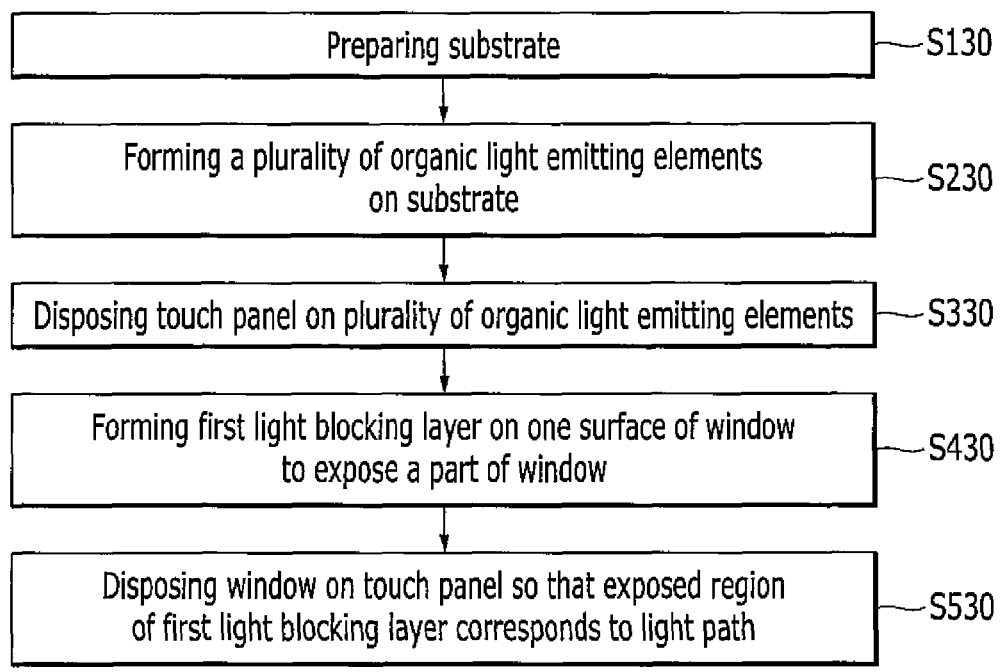
FIG. 10 is a flowchart of a manufacturing method of the organic light emitting diode display according to one or more exemplary embodiments of the present invention.

FIG. 10 is a flowchart illustrating a manufacturing method of the organic light emitting diode display according to one or more exemplary embodiments of the present invention, for example, the organic light emitting diode display of FIG. 5.

Referring to FIGS. 5 and 10, in the manufacturing method of the organic light emitting diode display according to one or more exemplary embodiments of the present invention, the process of forming the color filter layer CF in the manufacturing methods of the organic light emitting diode display as described above may be omitted. Furthermore, the process of forming the overcoat 530 covering the color filter layer CF may be omitted. That is, in some exemplary embodiments, in the manufacturing process, the process of forming the color filter layer CF may be omitted.

In the organic light emitting diode display according to one or more exemplary embodiments of the present invention, the first light blocking layers 850a, 850b, 850c, and 850d are formed on the lower surface of the window 900 to reduce external reflectance. Meanwhile, the first and second light blocking layers 850 and 860 may be integrally formed on the lower surface of the window 900, and as a result, process costs and a process time may be reduced as compared with the manufacturing process of the organic light emitting diode display in the related art.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

It will be understood that when an element such as a layer, film, region, or substrate is referred to as being "on" another element, it can be directly on the other element or intervening elements may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

The terminology used herein is for the purpose of describing particular embodiments only and is not intended to be limiting of the present invention. As used herein, the singular forms "a" and "an" are intended to include the plural forms as well, unless the context clearly indicates otherwise. In addition, unless explicitly described to the contrary, the words "comprise" and "include," and variations such as "comprises," "comprising," "includes" and "including," will be understood to imply the inclusion of stated elements but not the exclusion of any other elements. As used herein, the term "and/or" includes any and all combinations of one or more of the associated listed items. Expressions such as "at least one of," when preceding a list of elements, modify the entire list of elements and do not modify the individual elements of the list.

Spatially relative terms, such as "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present. Further, throughout the specification, the word "on" means positioning on or below the object portion, but does not essentially mean positioning on the upper side of the object portion based on a gravity direction.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

DESCRIPTION OF SOME OF THE SYMBOLS

310R: First organic light emitting element
310G: Second organic light emitting element
310B: Third organic light emitting element
510R: First color filter
510G: Second color filter
510B: Third color filter
600: First adhesive layer
700: Touch panel
800: Second adhesive layer
850: First light blocking layer
860: Second light blocking layer
900: Window

What is claimed is:

1. An organic light emitting diode display comprising:
a substrate;
a plurality of organic light emitting elements on the substrate and configured to emit light;
a touch panel on the plurality of organic light emitting elements;
a window on the touch panel;
a first light blocking layer at a surface of the window and corresponding to paths of light emitted from the plurality of organic light emitting elements and having an exposed region exposing a portion of the window; and
a second light blocking layer at the surface of the window and corresponding to an edge region of the window,
wherein the first light blocking layer is different in thickness from that of the second light blocking layer.

2. The organic light emitting diode display of claim 1, wherein the first and second light blocking layers are integral.

3. The organic light emitting diode display of claim 2, wherein the surface is a lower surface of the window.

4. The organic light emitting diode display of claim 3, wherein the first and second light blocking layers comprise a light blocking material.

5. The organic light emitting diode display of claim 1, wherein each of the plurality of organic light emitting elements comprises:
a first electrode on the substrate;
an organic emission layer on the first electrode and configured to emit light; and
a second electrode on the organic emission layer.

6. The organic light emitting diode display of claim 1, wherein the plurality of organic light emitting elements comprises first to third organic light emitting elements configured to emit light of red, green, and blue, respectively.

7. The organic light emitting diode display of claim 6, further comprising a color filter layer comprising first to third color filters, the first to third color filters corresponding to the paths of light of the first to third organic light emitting elements, respectively.

8. The organic light emitting diode display of claim 7, wherein the color filter layer is between the touch panel and the plurality of organic light emitting elements.

9. The organic light emitting diode display of claim 8, wherein
a first adhesive layer is between the color filter layer and the touch panel and a second adhesive layer is between the touch panel and the window.

10. The organic light emitting diode display of claim 7, wherein the color filter layer is at a surface of the window and at the exposed region of the first light blocking layer.

11. The organic light emitting diode display of claim 10, wherein a second adhesive layer is between the touch panel and the window.

* * * * *